US006767833B2

United States Patent
Shih et al.

(10) Patent No.: US 6,767,833 B2
(45) Date of Patent: Jul. 27, 2004

(54) METHOD FOR DAMASCENE REWORKING

(75) Inventors: Tsu Shih, Hsin-Chu (TW); Chen-Hua Yu, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 47 days.

(21) Appl. No.: 10/188,653

(22) Filed: Jul. 2, 2002

(65) Prior Publication Data

US 2004/0005782 A1 Jan. 8, 2004

(51) Int. Cl.$^7$ ............................................. H01L 21/702
(52) U.S. Cl. ..................... 438/706; 438/710; 438/712; 438/720; 438/780; 216/47
(58) Field of Search ............................... 438/706, 710, 438/712, 720, 780, 783; 216/47, 48

(56) References Cited

U.S. PATENT DOCUMENTS 5,652,693 A * 7/1997 Chou et al. ............... 361/306.1
6,429,105 B1 * 8/2002 Kunikiyo .................... 438/586
6,514,860 B1 * 2/2003 Okada et al. ............... 438/687

* cited by examiner

Primary Examiner—Lan Vinh
(74) Attorney, Agent, or Firm—Tung & Associates

(57) ABSTRACT

A method for avoiding processing damage to an anisotropically etched damascene feature in a reworking process including providing a first photoresist layer over a first anisotropically etched opening the first photoresist layer photolithographically patterned for forming a second anisotropically etched opening overlying the first anisotropically etched opening; blanket depositing a flowable resinous polymeric material to form a resinous layer over the first photoresist layer in a reworking process to include filling a remaining portion of the first anisotropically etched opening; removing the resinous layer and the first photoresist layer in a planarizing process to reveal an upper substrate surface; and, depositing a second photoresist layer over the upper substrate surface for photolithographic patterning of the second anisotropically etched opening overlying the first anisotropically etched opening in the reworking process.

20 Claims, 2 Drawing Sheets

METHOD FOR DAMASCENE REWORKING

FIELD OF THE INVENTION

This invention generally relates to photolithographic patterning of semiconductor features and more particularly to an improved method for reworking a damascene photolithographic patterning step.

BACKGROUND OF THE INVENTION

Since the introduction of semiconductor devices, the size of semiconductor devices has been continuously shrinking, resulting in smaller semiconductor chip size and increased device density. One of the limiting factors in the continuing evolution toward smaller device size and higher density has been the stringent requirements placed on photolithographic processes as line width and step heights have decreased for device features. As one way to overcome such limitations, various methods have been implemented to increase the resolution performance of photoresists and to eliminate interfering effects occurring in the semiconductor wafer manufacturing process.

In the fabrication of semiconductor devices multiple layers (levels) may be required for providing a multi-level interconnect structure. During the manufacture of integrated circuits it is common to place photoresist on top of a semiconductor wafer in desired patterns and to etch away or otherwise remove surrounding material not covered by the resist pattern in order to produce metal interconnect lines or other desired features. During the formation of semiconductor devices it is often required that the conductive layers be interconnected through holes in an insulating layer. Such holes are commonly referred to as vias, i.e., when the hole extends through an insulating layer between two conductive areas. Metal interconnecting lines (trench lines) are typically formed over the vias to electrically interconnect the various semiconductor devices within and between multiple layers. The damascene process is a well known semiconductor fabrication method for forming electrical interconnects between layers by forming vias and trench lines.

For example, in the dual damascene process, a via is etched in an insulating layer also known as an inter-metal or inter-level dielectric (IMD/ILD) layer. The insulating layer is typically formed over an underlying metal or conductive area. After a first photolithographic patterning step to define via openings a second photolithographic patterning step is carried out to define a trench line opening overlying and encompassing the via opening, the via openings and the trench openings then filled with metal (e.g., Al, Cu) to form an electrically conductive and contiguous dual damascene feature. The excess metal above the trench level is then typically removed and planarized by a chemical-mechanical polishing (CMP) processes to complete the manufacturing process of one level of a multi-level semiconductor device.

Frequently, the trench line photolithographic patterning step may fail due to a number of reasons including, for example, photomask misalignment, or an unsuccessful exposure and development process. As a result, the dual damascene feature may not be fully conductively contiguous leading to unacceptable electrical performance. To remedy these processing errors, the trench line photolithographic patterning step must be repeated requiring a reworking process to remove and reapply a photoresist layer for re-patterning including removing any residual photoresist or polymeric residue material remaining in the via opening. To remove the photoresist layer including residual photoresist or polymeric residue material, the prior art processes typically use at least one of a plasma dry etching process or a wet chemical stripping process.

One problem according to the prior art damascene reworking processes is that the via opening including the sidewalls and bottom portion may be damaged or leave residual photoresist or polymeric material thereby compromising the damascene feature to degrade performance including increasing resistivity.

There is therefore a need in the semiconductor processing art to develop a method for an improved damascene reworking process whereby damascene features including sidewall and bottom portions are protected from damage to improve damascene performance following reworking.

It is therefore an object of the invention to provide a method for an improved damascene reworking process whereby damascene features including sidewall and bottom portions are protected from damage to improve damascene performance following reworking while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for avoiding processing damage to an anisotropically etched damascene feature in a reworking process.

In a first embodiment, the method includes providing a substrate including a dielectric insulating layer including a first anisotropically etched opening formed in closed communication with an underlying conductive area the first anisotropically etched opening being at least partially filled with a plug of resinous polymeric material; providing a first photoresist layer over the first anisotropically etched opening the first photoresist layer photolithographically patterned for forming a second anisotropically etched opening overlying the first anisotropically etched opening; blanket depositing a flowable resinous polymeric material to form a resinous layer over the first photoresist layer in a reworking process to include filling a remaining portion of the first anisotropically etched opening; removing the resinous layer and the first photoresist layer in a planarizing process to reveal an upper surface of the substrate; and, depositing a second photoresist layer over the upper surface for photolithographic patterning of the second anisotropically etched opening overlying the first anisotropically etched opening in the reworking process.

These and other embodiments, aspects and features of the invention will become better understood from a detailed description of the preferred embodiments of the invention which are described below in conjunction with the accompanying drawings.

DETAILED DESCRIPTION OF THE PREFERRED EMBODIMENTS

While the invention is explained with reference to a dual damascene process, it will be appreciated that the same inventive concept can be applied to the formation of any semiconductor feature where it would be advantageous to protect an anisotropically etched feature from damage in subsequent processing steps including plasma etching or wet chemical processes by formation of a resinous material plug to protect the anisotropically etched semiconductor feature.

Figure 1A:
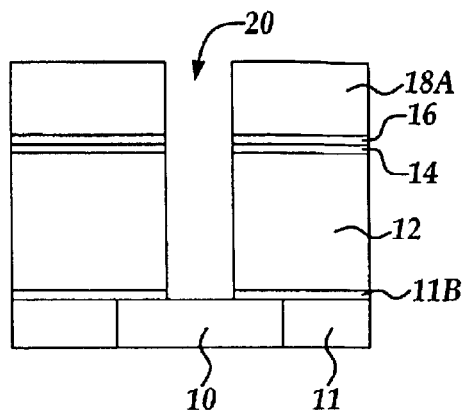
FIGS. 1A–1F are representative cross sectional side views of portions of a dual damascene structure at stages in the manufacturing process according to the present invention.

For example, referring to FIG. 1A, is shown a portion of a semiconductor device including a conductive region 10, for example, copper, formed in an insulating layer 11 and an overlying insulating (ILD) layer 12, for example a low-k (low dielectric constant) carbon doped silicon dioxide. Optionally, an etching stop layer 11B of for example, silicon nitride (e.g., $Si_3N_4$) or silicon oxynitride (e.g., SiON) is deposited over the insulating layer 11 prior to depositing ILD layer 12. ILD layer 12 and etching stop layer 11B are typically deposited by chemical vapor deposition (CVD) techniques including, for example, PECVD (plasma enhanced CVD), LPCVD (low pressure CVD), or HDPCVD (high density plasma CVD) as is known in the art. It will be appreciated that several different insulating materials including organic and inorganic materials as are known in the art may be used may be used for the IMD layer. Preferably, the dielectric constant of the low-k material is less than about 3.0. Additional exemplary low-k inorganic materials include, for example, porous oxides, xerogels, or SOG (spin-on glass). Exemplary low-k organic materials include, for example, polysilsequioxane, parylene, polyimide, benzocyclobutene amorphous Teflon, and spin-on polymer (SOP). A typical thickness of the ILD layer may range from about 6000 Angstroms to about 10,000 Angstroms.

A second metal nitride etching stop layer (hard mask layer) 14, for example, silicon nitride (e.g., $Si_3N_4$) or silicon oxynitride (e.g., SiON) is deposited over the ILD layer 12. The metal nitride layer is typically deposited by a chemical vapor deposition (CVD) process including for example, PECVD (plasma enhanced CVD), LPCVD (low pressure CVD), or HDPCVD (high density plasma CVD) by reacting silane ($SiH_4$) or an amine-containing metal-organic precursor with ammonia ($NH_3$) or nitrogen. The process includes oxygen under conditions known in the art in the case the metal nitride formed is silicon oxynitride.

A dielectric anti-reflective coating (DARC) layer 16 is then preferably deposited over the hard mask layer 14, to reduce undesired light reflections in a subsequent photolithographic patterning processes to define via openings and trench line openings. Preferably, the DARC layer 16 is silicon oxynitride (SiON), but may be other metal nitrides, such as titanium nitride (e.g., TiN). The DARC layer 16 and the hard mask layer 14 each are typically formed within a thickness range of about 200 to about 1000 Angstroms.

A first photoresist layer 18A is next deposited over the DARC layer and exposed and developed according to a conventional photolithographic patterning process to a pattern for plasma anisotropically etching via opening 20. Preferably, a deep ultraviolet (DUV) photoresist is used for patterning the via opening including exposing the photoresist layer 18A with an activating radiation source having a wavelength of less than about 250 nm. The photoresist may be any conventional DUV photoresist including, for example, a chemically amplified resist including a photogenerated acid. There are several suitable commercially available photoresists including for example, PMMA and polybutene sulfone.

Still referring to FIG. 1A, via opening 20 is anisotropically etched through a thickness of the DARC layer 16, the hard mask layer 14, and the IMD layer 12 to create via opening 20 in closed communication with the underlying conductive region 10. The anisotropic etching is preferably carried out by a conventional plasma reactive ion etch (RIE) process.

Figure 1B:
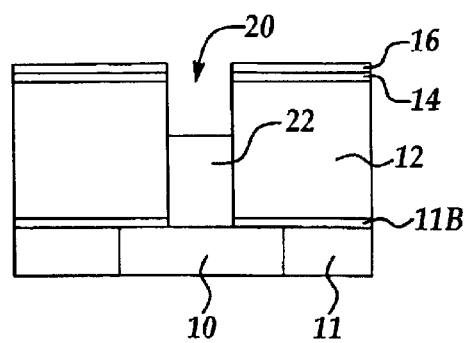

Referring to FIG. 1B, in the method according to the present invention, after removing the photoresist layer 18A by either a wet chemical process or preferably a plasma ashing process, a first flowable resinous polymeric material, preferably a photoresist, is blanket deposited by a spin coating process over the via opening 20 to fill the via opening 20 and then etched back by a plasma etching process to remove photoresist layer 18A form via plug 22. Prior to etchback to form via plug 22, the flowable resinous polymeric material is preferably first cured to initiate polymeric cross-linking reactions by a photo-curing process if a photoactive resinous material is used or alternatively, thermally cured. Preferably, the resinous polymeric material is etched back whereby via plug 22 is formed to at least partially fill via opening 20, for example, preferably extending to a level about equal to the depth of a subsequently anisotropically etched overlying trench line opening. The via plug 22 may then be optionally further cured further by either thermal or photo means as is known in the art. Exemplary resinous polymeric materials include methyl methacrylate, polyolefins, polyacetals, polycarbonates, polypropylenes and polyimides.

Figure 1C:
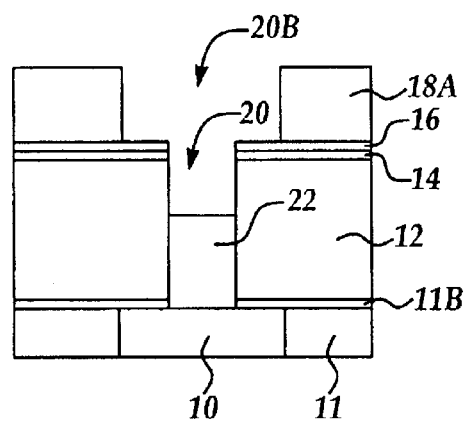

Referring to FIG. 1C, following formation of via plug 22, a trench line photoresist layer 18B (trench line photoresist) is deposited over the DARC layer 16 and photolithographically patterned to form a pattern e.g., 20B for anisotropically etching a trench line opening overlying via plug 22. Preferably the photoresist layer 18B includes a DUV photoresist designed for exposure and development at a wavelength less than about 250 nm as discussed with reference to via photoresist layer 18A in FIG. 1A. The DUV photoresist may also be used as the resinous polymeric material for forming via plug 22.

As it has been found that frequently, the trench line photolithographic patterning step as shown in FIG. 1C is unacceptable due to a number of reasons including, for example, photomask misalignment, or an otherwise unsuccessful exposure and development process, a reworking process is necessary to remove the DUV photoresist layer 18B in order to successfully reapply the DUV photoresist layer to repeat the trench line photolithographic patterning process. It has been found that a reworking process using a plasma ashing process and/or a wet chemical stripping process damages the via opening sidewalls and bottom portion adversely affecting electrical performance of a subsequently completed damascene or dual damascene.

Figure 1D:
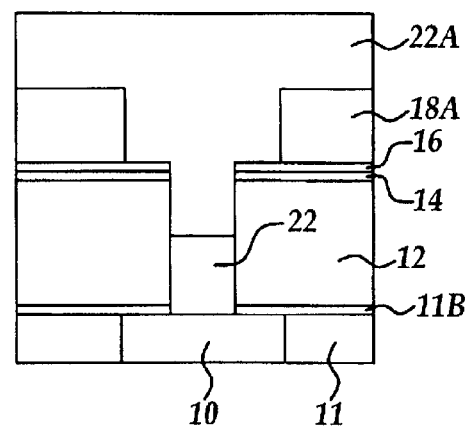

Referring to FIG. 1D, according to the reworking process of the present invention, damage to the via opening 20 including via sidewalls and via bottom portion by plasma etching or wet chemical stripping is avoided. In the reworking process of the present invention a second flowable resinous polymeric material is blanket deposited over the second DUV photoresist layer 18B to form resinous layer 22A. For example, the flowable resinous polymeric material layer may be a photoresist, for example, the same DUV photoresist used for the second DUV photoresist layer 18B. Alternatively, a different photoresist material or a resinous polymeric material such as those described for forming via plug 22 is also suitable. It will be appreciated that the resinous polymeric material need not be photoactive, however, a photoactive resinous polymeric material such as a photoresist is preferable to increase manufacturing efficiency and to allow for a photo-curing process of the resinous polymeric material. The photo or thermal curing process is preferably carried out following deposition of the resinous material to form resinous material layer 22A. For example, the thermal curing step is carried out at a temperature from about 100 Degrees Centigrade to about 160 degrees Centigrade and the photo-curing process includes exposure to light with a wavelength of less than about 400 nm by methods known in the art. The flowable resinous polymeric material is blanket deposited to fill a remaining portion of the via opening 20 and to cover the trench line DUV photoresist layer 18B to form resinous layer 22A. The second resinous material layer 22A is preferably deposited in the same manner as the first resinous material layer to form via plug 22, for example, by a conventional spin coating method. The thickness of the second resinous material layer 22A is preferably about the same as the photoresist layer 18B, for example, about 1000 to about 5000 Angstroms.

Figure 1E:
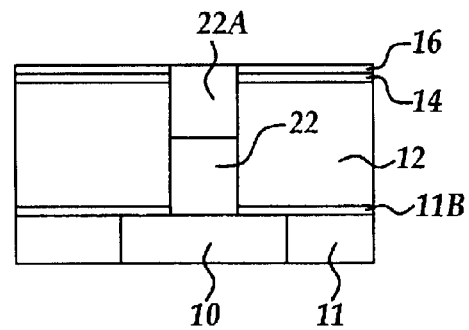

Referring to FIG. 1E, following deposition of resinous material layer 22A to fill via opening 20, the resinous material layer 22A is removed in a planarization process to include the second DUV photoresist layer 18B to reveal the DARC layer 16. Preferably, in one embodiment, the photoresist layers are removed according to a plasma etchback process including a conventional plasma etching chemistry of for example, hydrofluorocarbons and oxygen. Preferably, the plasma etchback process is carried out to end point detection of DARC layer 16. As will be appreciated, conventional optical means for monitoring plasma species may be used to detect an etching endpoint. In another embodiment, the resinous material layer 22A and DUV photoresist layer 18B are removed according to a convention chemical mechanic polishing (CMP) process.

Figure 1F:
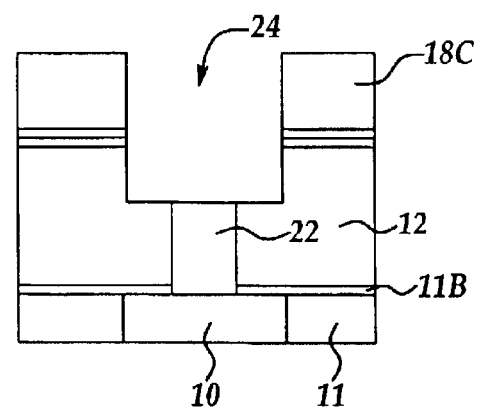

Referring to FIG. 1F, following the planarization process, DUV trench line DUV photoresist layer is reapplied to form reworked trench line DUV photoresist layer 18C. The reworked trench line DUV photoresist layer 18C is photolithographically patterned to form a trench line opening patterning for anisotropically etching a trench line opening. A conventional plasma anisotropic etching process is then carried out to etch through the exposed DARC layer 16 and etching stop (hard mask) layer 14, to include partially etching through via opening 20 and IMD layer 12 to about the level of the upper surface of the via plug 22 to form trench opening 24. Following the trench line etching process, the dual damascene feature opening including trench opening 24 is completed by a conventional RIE ashing process in an oxygen rich plasma and a wet chemical stripping process to substantially remove any remaining portion of material layer 22A and via plug 22.

The dual damascene structure is typically completed by conformally depositing a barrier layer (not shown) over the bottom portion and sidewalls of the dual damascene feature including trench line opening 28 and via opening 20 followed by filling the dual damascene feature with a metal, for example copper, and planarizing with a chemical mechanical polishing (CMP) process to define a dual damascene structure.

Figure 2:
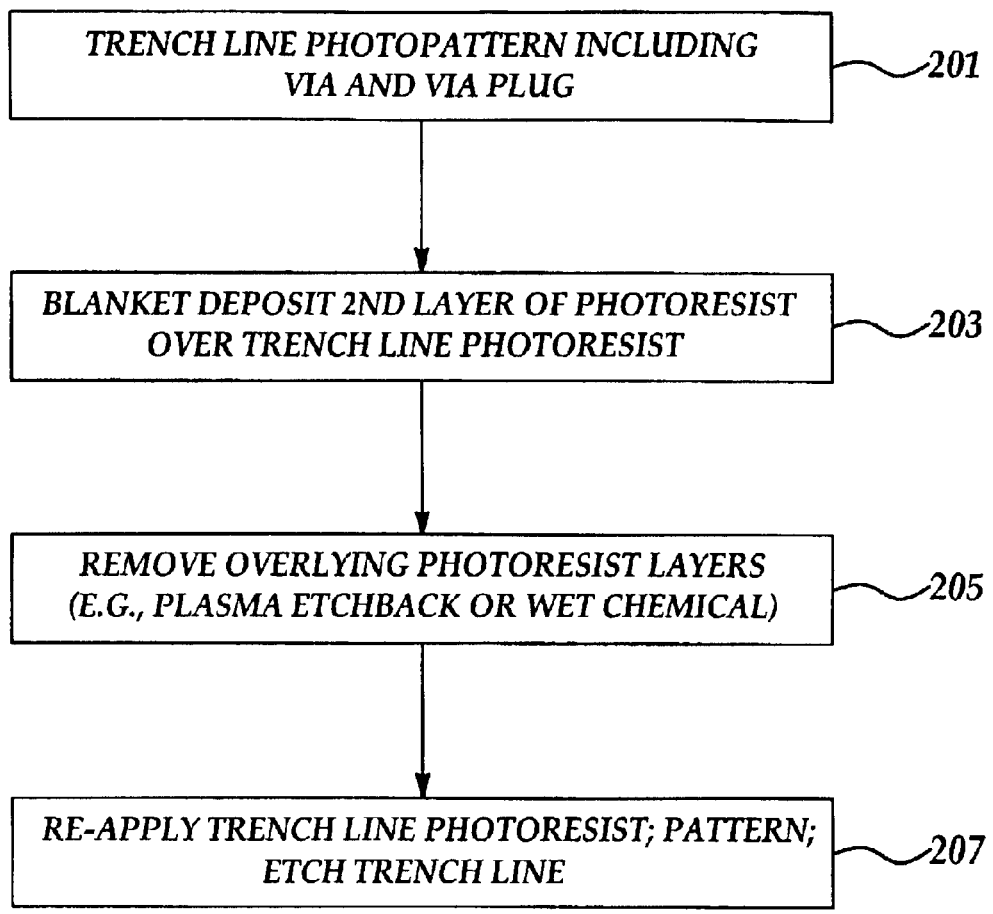
FIG. 2 is a representative process flow diagram according to several embodiments of the present invention.

Referring to FIG. 2 is shown a process flow diagram including several embodiments of the present invention. In a first process step 201 an anisotropically etched via opening including a resinous via plug partially filling via opening is provided having a trench line photolithographic pattern formed in an overlying trench line DUV photoresist layer requiring reworking. In a second process step 203, a flowable resinous polymeric material, for example, a second DUV photoresist layer is blanket deposited over the trench line DUV photoresist layer to include filling a remaining portion of the via opening to form an overlying resinous material layer. The resinous polymeric material may optionally be photoactive including being the same material as the trench line DUV photoresist layer. In a third process step 205, the overlying resinous layer, for example, a DUV photoresist, and the trench line DUV photoresist layer are removed by a planarization process to reveal a surface layer at the trench line level, for example, the DARC layer. The planarization process preferably includes a plasma etchback process to endpoint detection of the surface layer or includes a CMP process. In a fourth process step 207, trench line DUV photoresist layer is re-applied for repeating the trench line patterning process and the trench line opening anisotropically etched. The dual damascene feature opening is completed by an ashing and/or a wet chemical process to substantially remove any remaining photoresist and via plug material.

Thus, according to the present invention, a method has been provided for an improved damascene reworking process whereby damage to damascene features including sidewall and bottom portions is avoided during a reworking process. As a result, the electrical resistivity performance of a reworked damascene structure, including a dual damascene feature, is improved.

The preferred embodiments, aspects, and features of the invention having been described, it will be apparent to those skilled in the art that numerous variations, modifications, and substitutions may be made without departing from the spirit of the invention as herein disclosed and more particularly claimed below.

What is claimed is:

1. A method for avoiding processing damage to an etched damascene feature in a reworking process comprising the steps of:

providing a substrate comprising a dielectric insulating layer and a first etched opening formed in closed communication with an underlying conductive area the first etched opening being at least partially filled with a plug of first resinous polymeric material;

providing a first photoresist layer over the first etched opening the first photoresist layer photolithographically patterned for forming a second etched opening overlying the first etched opening;

forming a resinous layer of second resinous polymeric material over the first photoresist layer in a reworking process to include filling a remaining portion of the first etched opening;

removing the resinous layer and the first photoresist layer in a planarizing process to reveal an upper surface of the substrate; and, forming a second photoresist layer over the upper surface and photolithographically re-patterning the second photoresist layer for forming the second etched opening overlying the first etched opening.

2. The method of claim 1, wherein the resinous layer and the plug are selected from the group consisting of a photoresist, methyl methacrylate, polyolefins, polyacetals, polycarbonates, polypropylenes and polyimides.

3. The method of claim 1, wherein the first photoresist layer and the second photoresist layer are photosensitive to wavelengths of less than about 250 nm.

4. The method of claim 1, wherein the planarization process is selected from the group consisting of a plasma etchback process and a chemical mechanical polishing process.

5. The method of claim 1, wherein at least one a photo-curing and a thermal curing step is carried out prior to the removing step.

6. The method of claim 1, further comprising etching the second etched opening to about the level of the plug.

7. The method of claim 1, wherein the first etched opening and second etched opening respectively comprise a via opening and a trench line opening to form a dual damascene feature.

8. The method of claim 1, wherein the substrate a comprises a hard mask layer a nitride and a dielectric anti-reflective coating (DARC) layer comprising a nitride forming the upper surface of the substrate.

9. The method of claim 8, wherein the nitride is selected from the group consisting of silicon nitride, silicon oxynitride and titanium nitride.

10. The method of claim 1, wherein the resinous layer and the plug comprise at least one of a photo-curable and thermally curable resinous polymeric material for initiating cross-linking polymeric reactions.

11. The method of claim 10, wherein the resinous layer and the plug are photosensitive to wavelengths of less than about 250 nm.

12. The method of claim 11, wherein the resinous layer and the plug are formed comprising a curing step for initiating cross-linking polymeric reactions.

13. A method for avoiding processing damage to an damascene opening in a reworking process comprising the steps of:

providing a substrate comprising a dielectric insulating layer and a via opening at least partially filled with a plug of resinous polymeric material;

providing a first patterned photoresist layer over the via opening for forming a trench line opening overlying the via opening;

forming a second photoresist layer over the first photoresist layer in a reworking process to include filling a remaining portion of the via opening;

removing the second photoresist layer and first photoresist layer in a planarizing process to reveal an upper surface of the substrate; and, forming a third photoresist layer over the upper surface of the substrate for photolithographically re-patterning the trench line opening in the reworking process.

14. The method of claim 13, wherein the first, second, and third photoresist layers are photosensitive to wavelengths of less than about 250 nm.

15. The method of claim 13, wherein the step of removing is selected from the group consisting of a plasma etchback process and a chemical mechanical polishing process.

16. The method of claim 13, wherein at least one a photo-curing and thermal curing step is carried out following the step of forming a second photoresist layer.

17. The method of claim 13, wherein at least one of a photo-curing and thermal curing step is carried out following the step of removing.

18. The method of claim 13, further comprising the step of re-patterning the trench line opening.

19. The method of claim 13, further comprising the step of etching a trench line to about the level of the plug.

20. The method of claim 19, further comprising the step of removing a remaining portion of the plug according to at least one of a plasma ashing and wet chemical stripping step.

* * * * *